United States Patent [19]

Breslow et al.

[11] 4,271,259
[45] Jun. 2, 1981

[54] PHOTOSENSITIVE COMPOSITIONS CONTAINING A PHOTOOXIDIZABLE COMPONENT

[75] Inventors: David S. Breslow; David A. Simpson, both of Wilmington, Del.

[73] Assignee: Hercules Incorporated, Wilmington, Del.

[21] Appl. No.: 158,198

[22] Filed: Jun. 11, 1980

Related U.S. Application Data

[60] Continuation of Ser. No. 758,746, Jan. 12, 1977, abandoned, which is a continuation-in-part of Ser. No. 644,237, Dec. 24, 1975, abandoned, which is a division of Ser. No. 405,192, Oct. 10, 1973, abandoned.

[51] Int. Cl.³ .................................................. G03C 1/68
[52] U.S. Cl. .............................. 430/286; 204/159.15; 204/159.16; 430/281; 430/283; 430/288
[58] Field of Search .............. 430/270, 281, 283, 286, 430/288, 302, 306, 371; 204/159.15, 159.16

[56] References Cited

U.S. PATENT DOCUMENTS

| 3,764,324 | 10/1973 | Reyes | 96/35.1 |
| 3,840,390 | 10/1974 | Kozu et al. | 430/913 |
| 3,846,266 | 11/1974 | Duynstee et al. | 204/159.2 |

FOREIGN PATENT DOCUMENTS 7018306  6/1972  Netherlands .......................... 204/159.2

OTHER PUBLICATIONS

Duynstee et al., Sensitized Photooxidation of EPOM Rubber, Central Laboratory, DSM, Geleen, Netherlands, 6/14/72.

Primary Examiner—Jack P. Brammer
Attorney, Agent, or Firm—Marion C. Staves

[57] ABSTRACT

The invention concerns photosensitive compositions. The composition contains certain essential components which form peroxides when exposed to light. Essential to the composition are an ethylenically unsaturated component capable of forming a high polymer by addition polymerization or crosslinking, an oxidizable component containing allylic hydrogens, and a photooxygenation sensitizer.

4 Claims, No Drawings

PHOTOSENSITIVE COMPOSITIONS CONTAINING A PHOTOOXIDIZABLE COMPONENT

This application is a continuation of applicants' copending application Ser. No. 758,746, filed Jan. 12, 1977, now abandoned; which is in turn a continuation-in-part of application Ser. No. 644,237, filed Dec. 24, 1975, now abandoned; which is in turn a division of application Ser. No. 405,192, filed Oct. 10, 1973, now abandoned.

This invention relates to photosensitive compositions.

Compositions capable of being converted under the influence of actinic radiation to rigid, insoluble, tough structures have become increasingly important in the preparation of printing elements. One of the fundamental patents relating to such compositions is U.S. Pat. No. 2,760,863 to Plambeck. In the process of the Plambeck patent, printing elements are produced directly by exposing to actinic light, through an image bearing process transparency, a layer of an essentially transparent composition containing an addition polymerizable, ethylenically unsaturated monomer and an addition polymerization initiator activatable by actinic radiation. The layer of polymerizable composition is supported on a suitable support, and exposure of the composition is continued until substantial polymerization of the composition has occurred in the exposed areas with substantially no polymerization occurring in the nonexposed areas. The unchanged material in the latter areas then is removed, as by treatment with a suitable solvent in which the polymerized composition in the exposed areas is insoluble. In the case of printing plates, this results in a raised relief image which corresponds to the transparent image of the transparency and which is suitable for use in letterpress and dry off-set work.

While extremely useful in the preparation of relief printing elements and images from dry transfer processes, the photopolymer compositions of the types disclosed by the Plambeck patent become less sensitive to radiation due to the diffusion of oxygen from the air into the photopolymer layer. The oxygen acts to inhibit the desired polymerization and crosslinking reactions. There are means of removing or preventing oxygen from saturating or desensitizing the photopolymer layer. One way is to store or treat the element in an essentially oxygen-free atmosphere of an inert gas such as carbon dioxide. This technique gives satisfactory results but requires special equipment and is time-consuming. It also is known to add certain metal compounds such as tin salts, which are soluble in the photopolymer composition but which are nonreactive with the addition polymerization initiator. While a number of these compounds substantially reduce the influence of oxygen and improve the photographic speed of the photopolymer element, their utilization has not been entirely satisfactory.

Now, in accordance with this invention, there has been discovered photosensitive compositions useful in photochemical processes for the preparation of printing plates, which processes are not inhibited by oxygen. As a matter of fact, the processes depend upon oxygen being present during the exposure step. During exposure this ambient, triplet oxygen is converted to singlet oxygen which is involved in the formation of hydroperoxides and peroxides. These intermediates are subsequently decomposed, preferably in the absence of oxygen, generating free radicals which effect polymerization and/or crosslinking of the photosensitive composition. The photosensitive compositions comprise as essential compounds (1) an ethylenically unsaturated component capable for forming a high polymer by addition polymerization or crosslinking, (2) a photooxidizable component, different from the said polymerizable ethylenically unsaturated component, containing olefinic unsaturation of the type in which there is no more than one hydrogen atom on each of the double bond carbons and in which there is at least one allylic hydrogen on at least one of the carbons adjacent to the double bond carbons, which allylic hydrogen is not on a bridgehead carbon, and (3) a photooxygenation sensitizer. When the photosensitive compositions of this invention are exposed to light having a wave length of from about 2000 to about 12000 Angstroms in the presence of oxygen hydroperoxides and peroxides are formed. The said hydroperoxides and peroxides can be treated with heat, a metal catalyst or a non-metallic reducing agent to effect crosslinking of the polymer.

The photosensitive compositions of this invention are useful in the preparation of relief printing plates, but are particularly useful in the preparation of lithographic printing plates and photoresists.

The photosensitive compositions of this invention when deposited as a film on a support, can be selectively exposed to light and polymerized and/or crosslinked in the exposed areas. The unexposed areas of the film then are removed by use of a suitable solvent for the photosensitive composition or by other means such as use of an air knife exposing the substrate. The photosensitive compositions of this invention may be used to prepare negative or positive working lithographic plates. In preparing a negative working plate, the photosensitive compositions of this invention are deposited as a film on a metal backing support, are selectively exposed to light and polymerized and/or crosslinked in the exposed areas. The unexposed areas of the film are removed, exposing a hydrophilic metal substrate. If the high polymer formed in the exposed areas of the film is oleophilic, it accepts greasy ink, whereas the metal surface corresponding to the unexposed areas of the film, being hydrophilic, accepts water and rejects the greasy ink. In preparing a positive working plate, the photosensitive compositions are hydrophilic and are deposited as a film on an oleophilic backing sheet. Selective exposure to light polymerizes and/or crosslinks the exposed areas and the unexposed areas are then removed. Since the crosslinked polymer found in the exposed areas of the film is hydrophilic, it accepts water and rejects greasy ink, whereas the oleophilic backing corresponds to the unexposed area of the film accepts the greasy ink.

The process is believed to involve the formation of peroxides (peroxides or hydroperoxides) and their decomposition to generate free radicals which effect polymerization and crosslinking or crosslinking alone of the photooxidizable compositions. The initial reaction involves the photooxidation of an allylic hydrogen-containing component of the composition, resulting in the formation of peroxide groups on and in the film of said composition. The peroxides formed in the light-struck areas of the film then are decomposed, either concurrently with or subsequent to their formation, by the action of heat, or a metal catalyst or a reducing agent to provide the free radicals necessary for the polymerization and/or crosslinking reactions.

The above process is advantageous in that it is possible to utilize low light levels. Also, the process is not inhibited by oxygen during the exposure step. Furthermore, low levels of visible light are operative, thus making it possible to prepare printing plates by projection of a photographic transparency.

The process is also applicable to the preparation of lithographic camera plates. In this procedure, the copy is exposed to light, the light being absorbed in the dark areas of the copy and reflected by the light areas. The reflected light is passed through a lens system and projected on the surface of the photooxidizable composition.

The photosensitive compositions of this invention and their use is illustrated more specifically by the following examples. In all the examples, the solution preparation, film coating and subsequent operations are carried out in the dark under safe lights.

EXAMPLE 1

This example illustrates the insolubilization of a film of hydroxypropyl cellulose containing pentaerythritol triacrylate and the reaction product of Bisphenol A and 1,2,4-trimethyl-4-chlorocarbonylcyclohexene, 1, as the photooxidizable material. Vanadium oxyacetylacetonate was employed as the catalyst.

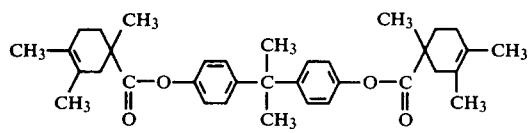

Bisphenol A, 4.4 g. (0.019 mol), and triethylamine, 3.9 g. (0.038 mol), were dissolved in 40 ml. of anhydrous diethyl ether under a nitrogen atmosphere. A solution of 7.2 g. (0.038 mol) of 1,2,4-trimethyl-4-chlorocarbonylcyclohexene (prepared by the Diels-Alder reaction of 2,3-dimethyl-1,3-butadiene and methacrylyl chloride) in 10 ml. of anhydrous diethyl ether was added dropwise at ambient temperature to the Bisphenol A solution, and the resulting mixture was stirred for two days under nitrogen. The reaction mixture was transferred to a separatory funnel and extracted successively with 5% hydrochloric acid, water, and saturated aqueous sodium chloride. The ether layer was dried over anhydrous magnesium sulfate, filtered, and the ether removed under vacuum to give a viscous liquid. The product was purified by column chromatography on silica gel and 7.8 g. (76%) of a white solid, m.p. 54°–56° C., was isolated. NMR, IR, and mass spectral analyses were consistent with the assigned structure.

A sheet of 14×14 cm. grained aluminum (Lith-Kem-Ko Division of Lith-Kem Corporation, Lynbrook, N.Y.) was pretreated to improve adhesion by coating with a five percent by volume solution of γ-methacryloxypropyltrimethoxy silane (Union Carbide, A-174 Silane) in methanol. The coating was applied with a whirl coater (Tasopé Face Up Whirler, Tasopé Co., Aurora, Mo.) and heated for two minutes under the whirler's infrared lamps.

A photooxidizable composition was prepared as follows:

|  | Grams |
| --- | --- |
| hydroxypropyl cellulose (Klucel GF, Hercules Incorporated) | 0.100 |
| pentaerythritol triacrylate | 0.075 |
| 1 | 0.23 |
| rose bengal | 0.0043 |
| solvent - 11 ml. of anhydrous ethanol; the solution was filtered before coating. | |

The solution was coated on the pretreated grained aluminum sheet using the Tasopé whirler at maximum speed. The dried film thickness was about three microns. The dried film was covered with a Stauffer 21 Step Sensitivity Guide (#AT 20×0.15) and exposed for five minutes from a distance of 60 cm. to a 375 watt Sylvania R32 photoflood lamp. Following exposure, the step guide was removed and the film was degassed by several evacuation-nitrogen flush cycles. The film was then covered with a similarly degassed solution of vanadium oxyacetylacetonate in benzene (0.10 gm./100 ml.) under a nitrogen atmosphere. After 30 minutes, the film was removed from the catalyst solution and etched in water. The unexposed areas of the film were removed, exposing the aluminum, whereas the exposed areas were insolubilized.

EXAMPLE 2

This example illustrates the use of sulfur dioxide as the peroxide reducing agent for the photosensitive composition described in Example 1.

Film preparation, exposure, and film degassing were carried out as described in Example 1. The film was then contacted with a gaseous mixture of sulfur dioxide (two and one-half percent by volume) and nitrogen for 30 minutes. The film was etched in water and exhibited insolubilization through step #16.

EXAMPLE 3

This example illustrates the insolubilization of a film of hydroxypropyl cellulose containing N,N'-methylene-bis-acrylamide and the compound shown in formula 1, as the photooxidizable material. Vanadium oxyacetylacetonate was employed as the catalyst.

A photosensitive composition was prepared as follows:

|  | Grams |
| --- | --- |
| hydroxypropyl cellulose (Klucel GF, Hercules Incorporated) | 0.479 |
| N,N'-methylene-bisacrylamide | 0.096 |
| 1 | 0.112 |
| rose bengal, added in two ml. of water | 0.0138 |
| solvent - 16 ml. of methyl cellosolve; the solution was filtered before coating | |

The solution was coated on pretreated grained aluminum (Example 1) using the whirl coater to obtain a dried film thickness of about five microns. The dried film was exposed by projection through a set of Kodak Wratten Gelatin Filters described below:

| Step No. | Filter Density |
| --- | --- |
| 1 | 0 |

| Step No. | Filter Density |
| --- | --- |
| 2 | 0.3 |
| 3 | 0.6 |
| 4 | 0.9 |
| 5 | 1.2 |
| 6 | 1.5 |
| 7 | 1.8 |
| 8 | 2.0 |
| 9 | 2.3 |
| 10 | 2.6 |

A Bell & Howell 16 mm. movie projector was used to expose the film from a distance of 3.4 meters. The exposure time was three minutes.

The film was degassed and treated with vanadium oxyacetylacetonate in benzene as described in Example 1. The film was washed with water in a commercial etching unit for two minutes. A sharp image of the step wedge was produced, with insolubilization visible through step #5.

EXAMPLE 4

This example illustrates the insolubilization of a film of pentaerythritol triacrylate and diethyl 1,2-dimethyl-cyclohexene-trans-4,5-dicarboxylate, 2, as the photooxidizable material. Vanadium oxyacetylacetonate was employed as the catalyst.

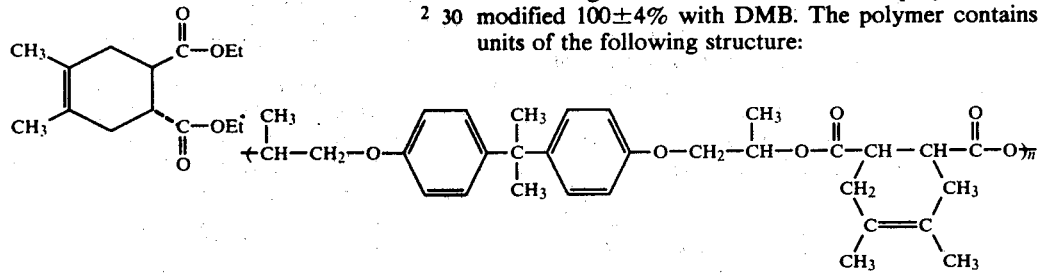

A photosensitive composition was prepared as follows:

|  | Grams |
| --- | --- |
| pentaerythritol triacrylate | 8.34 |
| zinc tetraphenylporphin, in 1.4 ml. of chloroform | 0.055 |
| 2 (prepared by the Diels-Alder reaction of ehtyl fumarate and 2,3-dimethyl-1,3-butadiene) | 0.45 |

The solution was coated on a glass plate using a five mil doctor blade and exposed by projection through the Kodak Wratten Filter wedge described in Example 3. A 375 watt Sylvania R32 photoflood lamp was employed from a distance of 1.4 meters. The exposure time was 10 minutes.

Following exposure, the plate was stored in a nitrogen atmosphere for 30 minutes and then sprayed with a degassed, 0.1% solution of vanadium oxyacetylacetonate in methanol. After 10 minutes, the plate was etched in acetone, this resulting in a good image of the step wedge and visible insolubilization through step #9.

EXAMPLE 5

This example illustrates the insolubilization of a film of a composition containing an unsaturated polyester, diallyl adipate, cobalt naphthenate, and a modified, unsaturated polyester as the photooxidizable material.

The photooxidizable material was prepared by the Diels-Alder reaction of a fumarate polyester (Atlac 382E, molecular weight 3,000, Atlas Chemical Industries; based on Bisphenol A and propylene oxide) with 2,3-dimethyl-1,3-butadiene (DMB). Twenty-five grams Atlac 382E (0.059 mol. unsaturation) and 9.70 g. of DMB (0.118 mol., 100% excess), were dissolved in 25.0 g. of reagent grade toluene in a 200.0 ml. polymerization bottle. The reaction was run under air. To prevent crosslinking of the polyester, about 1% hydroquinone was added as an inhibitor. The reaction mixture was heated at 100° C. for 24 hours. (Analysis for unreacted DMB by gas-liquid chromatography indicated the reaction was complete after 22.5 hrs.). The polymer was precipitated by pouring the reaction mixture into about 800.0 ml. of rapidly stirring hexane. The solvent was decanted and the gummy polymer was redissolved in benzene, filtered through glass wool, reprecipitated by pouring into hexane, and dried. A study of the product, and of Atlac 382E and hydrogenated Atlac 382E, by nuclear magnetic resonance indicated the polyester was modified 100±4% with DMB. The polymer contains units of the following structure:

A photosensitive composition was prepared as follows:

|  | Grams |
| --- | --- |
| Atlac 382E | 0.75 |
| DMB-Atlac 382E | 0.25 |
| diallyl adipate | 0.10 |
| cobalt naphthenate (Tenneco, Nuodex, 6% Co) | 0.033 |
| methylene blue, in 1.6 ml. of chloroform | $2.2 \times 10^{-4}$ |

The solution was coated on grained aluminum using a 10 mil doctor blade. The dried film was covered with a photographic negative and exposed for 15 minutes from a distance of 30 cm. to a 375 watt Sylvania R32 photoflood lamp. During exposure the film was cooled by an air blower. Following exposure, the film was heated under nitrogen at 80° C. for 30 minutes and then etched in tetrahydrofuran (THF) for about one minute. A relief image of the negative remained in the exposed areas of the film.

EXAMPLE 6

This example illustrates the insolubilization of a film of an unsaturated polyester containing pentaerythritol triacrylate and a modified, unsaturated polyester as the photooxidizable material. Vanadium oxyacetylacetonate was employed as the catalyst.

A photosensitive composition was prepared as follows:

|  | Grams |
| --- | --- |
| Altac 382E | 0.75 |
| DMB-Atlac 382E (prepared as in Example 5) | 0.75 |
| pentaerythritol triacrylate | 0.50 |
| zinc tetraphenylporphin | 0.20 |
| solvent - 18 ml. of benzene | |

The solution was coated on grained aluminum using the whirl coater at maximum speed. The film was allowed to air dry for 30 minutes, and then was exposed as described in Example 3 for 10 minutes. The film was placed under nitrogen for 90 minutes. The plate was carefully brushed with a degassed solution of 0.05 g. of vanadium oxyacetylacetonate in 25 ml. of methanol and allowed to stand under nitrogen for 15 minutes. The plate was removed and dipped in a 50—50 hexane-benzene solution. The unexposed areas dissolved away exposing the aluminum and leaving undissolved polymer through step #10.

EXAMPLE 7

This example illustrates the insolubilization of a film of a composition containing a chain extended, unsaturated polyester, modified to be photooxidizable, and diallyl adipate and vanadium oxyacetylacetonate.

A fumarate polyester (Atlac 382E, molecular weight 3,000, Atlas Chemical Industries; based on Bisphenol-A and propylene oxide) was chain extended with toluene diisocyanate and partially modified in a Diels-Alder reaction with 2,3-dimethyl-1,3-butadiene (DMB).

Atlac 382E, 25 g., was dissolved in 100 ml. of benzene and about 25 ml. of benzene was distilled off under a nitrogen atmosphere. Toluene diisocyanate, 1.16 g. ($6.67 \times 10^{-3}$ mol), and five microliters of a 10% solution of stannous octoate in hexane was added to the Atlac solution, and the reaction mixture was refluxed overnight. The polymer was precipitated by pouring the viscous solution into one liter of hexane. The polymer was isolated, redissolved in benzene, filtered through glass wool, reprecipitated from one liter of hexane, and dried at 50° C. under pump vacuum overnight. A 1% solution of the chain extended polymer in benzene had a specific viscosity of 0.30 at 25° C., compared to 0.13 for Atlac 382E.

The chain extended Atlac 382E was partially modified in a Diels-Alder reaction with 2,3-dimethyl-1,3-butadiene (DMB). The chain extended Atlac, 25 g. (0.059 mol unsaturation), DMB, 0.92 g. (0.011 mol), and 0.025 g. of copper powder were added to a polymerization bottle with 90 ml. of reagent grade toluene. The bottle was capped under air and heated at 80° C. overnight. The copper was removed and the modified polymer precipitated by filtering the solution into one liter of hexane. The polymer was isolated, redissolved in benzene, reprecipitated from one liter of hexane, and dried at ambient temperature under pump vacuum overnight. NMR examination of the polymer indicated 10–20% modification by DMB. This polymer will be referred to as chain extended, DMB-Atlac 382E.

A photosensitive composition was prepared as follows:

|  | Grams |
| --- | --- |
| chain extended, DMB-Atlac 382E | 1.00 |
| diallyl adipate | 0.10 |
| vanadium oxyacetylacetonate, in 0.7 ml. of methylene chloride and 1.2 ml. of acetone | 0.010 |
| rose bengal, in 0.2 ml. of 20/80 (vol./vol.) methanol/acetone acetone - 0.5 ml. | $6 \times 10^{-4}$ |

The solution was coated on vinyltriethoxysilane-primed grained aluminum using a 10 mil doctor blade. The dried film was exposed as described in Example 5, placed in a vacuum at 80° C. for 30 minutes, and etched in THF. The unexposed areas dissolved, exposing the aluminum and leaving an excellent reproduction of the negative.

Another photosensitive composition was prepared as follows:

|  | Grams |
| --- | --- |
| chain extended, DMB-Atlac 382E | 3.00 |
| diallyl adipate | 0.20 |
| vandium oxyacetylacetonate, in 0.04 ml. of methylene chloride | 0.0021 |
| methylene blue, in 0.3 ml. of methylene chloride | $3.1 \times 10^{-4}$ |
| solvent - seven ml. of methylene chloride | |

The solution was coated on vinyltriethoxysilane-primed grained aluminum to give a dried film thickness of 20 mils. The film was exposed as described in Example 5 with air blower cooling, heated in air at 80° C. for 30 minutes, and etched by lightly brushing the film in acetone. A relief image of the negative remained in the exposed areas of the film.

EXAMPLE 8

This example illustrates the insolubilization of a film of a composition containing a chain extended, unsaturated polyester, modified to be photooxidizable, and diallyl adipate and cobalt naphthenate.

A photosensitive composition was prepared as follows:

|  | Grams |
| --- | --- |
| chain extended, DMB-Atlac 382E (described in Example 7) | 1.00 |
| diallyl adipate | 0.10 |
| cobalt naphthenate (Tenneco, Nuodex, 6% Co) | 0.033 |
| methylene blue, in 1.6 ml. of chloroform | $2.2 \times 10^{-4}$ |

Film preparation and exposure were as described in Example 5. The film was etched in THF and, upon drying, a sharp image of the negative remained.

EXAMPLE 9

This example illustrates the insolubilization of a film of an unsaturated polyester containing cobalt naphthenate and a modified, unsaturated polyester as the photooxidizable material.

The example was carried out in a manner identical to that of Example 5, except the diallyl adipate of Example 5 was excluded from the composition. After etching, an image of the negative was visible.

EXAMPLE 10

This example illustrates the insolubilization of a film of natural rubber containing pentaerythritol triacrylate and ferric acetylacetonate. The natural rubber serves as the photooxidizable material.

A photosensitive composition was prepared as follows:

|  | Grams |
| --- | --- |
| pale crepe natural rubber (precipitated once from methanol) | 0.535 |
| pentaerythritol triacrylate | 0.054 |
| ferric acetylacetonate | in 1.3 ml. $2.7 \times 10^{-4}$ of |
| benzoin | chloroform $1.6 \times 10^{-3}$ |
| zinc tetraphenylporphin | 0.088 |
| solvent - 20 ml. of benzene | |

The solution was coated on primed grained aluminum (Example 1) using the whirl coater to obtain a dried film thickness of about two microns. The film was exposed with air blower cooling for 10 minutes, as described in Example 1. Immediately following exposure, the sample was placed in a nitrogen atmosphere for 45 minutes and then etched in benzene. The exposed areas were insolubilized through step #5.

EXAMPLE 11

This example illustrates the insolubilization of a film of ethylene-propylene-ethylidenenorbornene terpolymer rubber (EPsyn 40-A EPDM, Copolymer Rubber and Chemical Corp., $5.8 \times 10^{-4}$ mol unsaturation/gm., Mooney Viscosity of 40 (ML-8' @ 250° F.) containing pentaerythritol triacrylate and ferric acetylacetonate. The EPDM rubber serves as the photooxidizable material.

A photosensitive composition was prepared as follows:

|  | Grams |
| --- | --- |
| EPsyn 40-A EPDM (precipitated once from methanol, | 0.375 |
| pentaerythritol triacrylate | 0.030 |
| ferric acetylacetonate | in 0.9 ml. $1.9 \times 10^{-4}$ of |
| benzoin | chloroform $1.1 \times 10^{-3}$ |
| zinc tetraphenylporphin | 0.050 |
| solvent - 11 ml. of benzene | |

The solution was coated on primed grained aluminum (Example 1) using the whirl coater to obtain a dried film thickness of about four microns. The film was exposed with air blower cooling as described in Example 1, and subsequently treated as described in Example 10. The unexposed areas were removed, baring the aluminum, while the exposed areas were insolubilized through step #11.

EXAMPLE 12

This example illustrates the insolubilization of a film of poly(N,N-dimethylacrylamide) containing N,N'-methylene-bis-acrylamide and diethyl 1,2-dimethylcyclohexene-trans-4,5-dicarboxylate, 2, as the photooxidizable material, the insolubilized film having the ability to reject ink.

A solution of 36.0 g. of hydroxypropyl cellulose (Klucel L, Hercules Incorporated) 5.4 g. of dimethylol urea, and 0.27 g. of p-toluenesulfonic acid in 972 ml. of water was used to whirl-coat six mil grained aluminum plates. The coated plates were cured for 15 minutes at 125° C. A solution of the following composition was prepared and whirl-coated on one of the coated plates:

| poly(N,N-dimethylacrylamide) (intrinsic viscosity, 2.34 in water at 25° C.) | 1.0 g. |
| --- | --- |
| N,N'-methylene-bisacrylamide | 0.5 g. |
| Diethyl 1,2-dimethylcyclohexene-trans-4,5-dicarboxylate | 0.18 g. |
| zinc tetraphenylporphin | 0.074 g. |
| ethanol | 10 ml. |
| chloroform | 10 ml. |

The plate was allowed to dry for one hour, and was exposed for 10 minutes as described in Example 3. The plate was placed under nitrogen for two hours and sprayed with a degassed solution of 0.2% (wt/vol) vanadium oxyacetylacetonate in methanol. After standing under nitrogen for 10 minutes, the plate was removed and washed with tap water. The (poly)N,N-dimethylacrylamide layer remained in the exposed areas through step #6, but it dissolved off the rest of the plate, exposing the hydroxypropyl cellulose sublayer. The plate was wiped with Rosos offset fountain solution (3 oz./gal.) and coated with Lith-Kem-Ko rub-up ink. The ink was rejected in the insolubilized areas and was accepted in the background areas.

The photosensitive compositions of this invention must contain an oxidizable component which will contribute to the composition at least $1.0 \times 10^{-3}$ moles per 1000 cc. of the composition, and preferably at least $1.0 \times 10^{-2}$ moles per 1000 cc. of the composition, of olefinic unsaturation of the type in which there is no more than one hydrogen atom on each of the double bond carbons and in which there is at least one allylic hydrogen on at least one of the carbons adjacent to the double bond carbons, which allylic hydrogen is not on a bridgehead carbon. Such unsaturation can be termed photooxidizable unsaturation, and an example of this type of unsaturation is illustrated by the structural unit

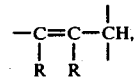

in which R is hydrogen or $C_1$–$C_6$ alkyl.

In general, suitable photooxidizable unsaturation, whether in a polymer or a low molecular weight compound, will be that providing olefinic units corresponding to those of the general formula

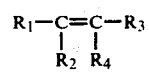

wherein the $R_1$, $R_2$, $R_3$ and $R_4$ substituents may be hydrogen, an alkyl group containing one to twenty carbon atoms, an aryl group or a substituted aryl group. Furthermore, $R_1$ and $R_2$, $R_3$ and $R_4$, $R_1$ and $R_3$ and $R_2$ and $R_4$ may be combined in the form of an alicyclic or heterocyclic ring. However, one of the R's must contain the

group in order that at least one allylic hydrogen atom is present, and the carbon in this group can not be a bridgehead carbon. Also, at any one time, when any of the R's is hydrogen, there can be no more than one hydrogen on each of the double bond carbons.

When the R's are alkyl, they may be straight chain alkyl, such as methyl, ethyl, n-propyl, n-butyl, n-amyl, n-hexyl, or octadecyl. Moreover one of them may be a branched chain alkyl, such as isopropyl, isobutyl, t-butyl and isoamyl, as long as none of the remaining R's is branched. Also, one of the R's may be an unsaturated alkyl group containing a carbon-carbon double bond in conjugation with the olefinic double bond. When the R's are aryl, there normally will be no more than two of them which are aryl and they ordinarily will be singly substituted on the double bond carbons. The aryl substituents, such as phenyl and naphthyl, also may themselves be substituted with —R', —OR',

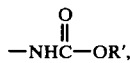

—Cl, —Br and —F substituents, wherein R' is an alkyl group containing one to six carbon atoms, or is aryl, such as phenyl. Furthermore, if only one of the R's is aryl, then the aryl group may contain a —CN,

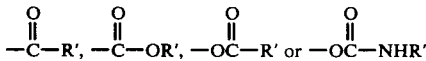

substituent. These same substituents, plus the

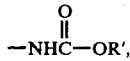

—Cl, —Br and —F substituents listed earlier, also may occur elsewhere in the polymer molecule provided they are separated from the olefinic unsaturation in the polymer by at least one carbon atom, and preferably by two or more carbon atoms.

The desired photooxidizable unsaturation may be present in the composition in the form of mono-, or polyfunctional (di- or greater) unsaturated materials. Representative examples of monounsaturated photooxidizable materials include trimethylethylene, tetramethylethylene, 1,2-dimethylcyclohexene, diethyl-1,2-dimethylcyclohexene-4,5-dicarboxylate, 2-ethylidenenorbornene, 2-methyl-norbornene, 2,3-dimethyl-norbornene, cyclopentene, 1-methyl-cyclopentene, 1,2-dimethyl-cyclopentene, α,β,β-trimethylstyrene, indene, alkyl-substituted indenes and alkyl-substituted furans.

A representative example of diunsaturated photooxidizable material is the reaction product of Bisphenol A and 1,2,4-trimethyl-4-chlorocarbonylcyclohexane, 1. Representative examples of polyunsaturated photooxidizable materials include the EPDM rubbers, natural rubber, the homopolymers and copolymers of butadiene, isoprene, 2,3-dimethyl-1,3-butadiene and 1,3-pentadiene, and the copolymers of these dienes with vinyl monomers such as acrylic and methacrylic acids, their esters and amides, styrene, vinyl pyridine, vinyl ethers, sulfides, esters, ketones and halides, vinylidene halides and allyl ethers and esters. Polyunsaturated photooxidizable materials may additionally contain certain other types of unsaturation, for example fumarate or maleate unsaturation, or the type represented by the characteristic $CH_2=C<$ group.

When the photooxidizable unsaturation is not already present in a polymer structure, it may be introduced into a base polymer. Exemplary of such base polymers are unsaturated polyesters, into which the desired unsaturation may be introduced through utilization of the Diels-Alder reaction. Also, since esterification reactions may be used to introduce the olefinic unsaturation into polymers containing hydroxyl groups, the base polymers may include polymers such as poly(vinyl alcohol) and poly(vinyl acetate) which has been partly hydrolyzed; partly or completely hydrolyzed copolymers of vinyl acetate with other vinyl monomers such as vinyl chloride; cellulose and cellulose esters; starch, cellulose which has been partly or completely reacted with an alkylene oxide, such as ethylene oxide or propylene oxide, for example, hydroxyethyl cellulose or hydroxypropyl cellulose; phenoxy resins and other resins prepared by condensing a polyhydroxy compound with epichlorohydrin; polymers or copolymers of hydroxyalkyl acrylates or methacrylates; polymers or copolymers of hydroxyalkyl vinyl sulfides; and polymers or copolymers of hydroxyalkyl acrylamides.

The reactant utilized to introduce the photooxidizable olefinic unsaturation into the base polymer must provide allylic hydrogen to the product polymer, that is, the latter must contain at least one hydrogen on at least one of the carbons adjacent to the double bond carbons, which allylic hydrogen is not on a bridgehead carbon. Furthermore, it is necessary in the product polymer that there be no more than one hydrogen atom on each of the double bond carbons. The choice of reactant will depend upon the reaction involved in preparing the product polymer. Thus, 1,3-butadiene, isoprene and 2,3-dimethyl-1,3-butadiene preferably are used in a Diels-Alder reaction, as with an unsaturated polyester. However, the use of cyclopentadiene in this reaction will not provide products useful in the process of this invention, since such products have the allylic hydrogens attached to bridgehead carbons. In an addition polymerization reaction, a reactant such as 5-ethylidene-2-norbornene is used to obtain the desired unsaturation. In an esterification reaction, the acid, acid halide, acid anhydride or ester reactant will contain the desired unsaturation somewhere in the molecule. Thus, depending upon the reaction involved, suitable reactants are exemplified by those which provide olefinic units such as those existing in butene-2, trimethylethylene, tetramethylethylene, 1,2-dimethyl cyclohexene, 2-ethylidenenorbornene, 2-methyl-2-norbornene, 2,3-dimethyl-2-norbornene, cyclopentene, 1-methylcyclopentene, 1,2-dimethyl cyclopentene, α,β,β-trimethyl styrene, indene and alkyl-substituted indenes, and alkyl-substituted furans.

Also essential to the compositions used in the process of this invention is an ethylenically unsaturated component, different from the said photooxidizable component, capable of forming a high molecular weight polymer by addition polymerization or crosslinking. This component should comprise from about 5% to about 98% of the photosensitive composition. This component may be either monomeric or polymeric, and mixtures of monomers and of polymers and of monomers with polymers may be used. The preferred monomers are those having terminal ethylenic unsaturation of the $CH_2=C<$ type. When using a monoethylenically unsaturated monomer it is necessary to have a polymeric component or a polyfunctional monomeric component also present. Such a polymeric component is preferably an unsaturated polymer which will copolymerize with the monomer to form a crosslinked polymer. Representative of the monoethylenically unsaturated monomers are acrylic and methacrylic acids, their esters with $C_1$-$C_{20}$ monohydric alcohols, for example, methyl acrylate, ethyl acrylate, n-butyl acrylate, methyl methacrylate and isopropyl methacrylate, and their esters with other alcohols, for example, hydroxyethyl acrylate, hydroxyethyl methacrylate, dimethylaminoethyl acrylate, dimethylaminoethyl methacrylate and 2-chloroethyl acrylate, acrylamide, methacrylamide, N-vinylpyrrolidone, acrylonitrile and methacrylonitrile; vinyl esters such as vinyl acetate, vinyl trimethylacetate, vinyl propionate and vinyl benzoate; vinyl ethers and sulfides such as methyl vinyl ether and methyl vinyl sulfide; vinyl ketones such as methyl vinyl ketone; vinyl halides and vinylidene halides such as vinyl chloride and vinylidene chloride; allyl ethers such as allyl phenyl ether and allyl isoamyl ether; allyl esters such as allyl acetate, allyl butyrate and allyl benzoate; and vinyl aromatics such as styrene and α-methylstyrene.

In addition to or in place of the above monomers, which are all monoethylenically unsaturated, it is advantageous to utilize in the photosensitive composition, as all or part of the ethylenically unsaturated component, monomers which are polyethylenically unsaturated, since such monomers ordinarily provide a more tightly crosslinked system. These crosslinking monomers have their unsaturation in the form of at least two

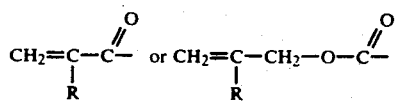

groups, wherein R is hydrogen or a $C_1$-$C_3$ alkyl group. One useful monomer is 1,3,5-triacryloylhexahydro-1,3,5-triazine. This compound and related compounds such as the corresponding methacryloyl derivative have the structural formula

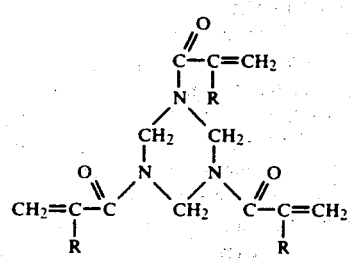

wherein R is hydrogen or a $C_1$-$C_3$ alkyl group.

Other suitable monomers may be defined by the structural formula

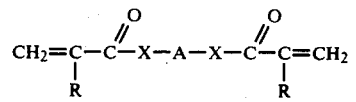

wherein R again is hydrogen or a $C_1$-$C_3$ alkyl group, both X's are either —NH— or —O— and A is alkylene, substituted alkylene or alkylene oxy alkylene. Exemplary of the latter are those compounds having the formula

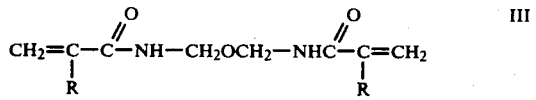

A preferred monomer having this formula is N,N′-oxydimethylene-bis(acrylamide).

When X in formula II above again is —NH—, but A is alkylene or substituted alkylene, this is descriptive of another preferred monomer, N,N′-methylene-bis(acrylamide). This compound is one member of a group of monomers for use in the process of this invention, which monomers are represented by compounds having the formula

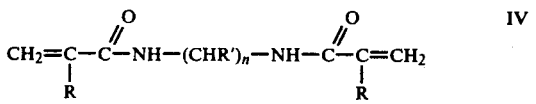

wherein R is hydrogen or a $C_1$-$C_3$ alkyl group, R′ is hydrogen, a $C_1$-$C_3$ alkyl group or phenyl, n is 1 to 6 when R′ is hydrogen and 1 when R′ is a $C_1$-$C_3$ alkyl or phenyl group.

Representative of compounds of formula IV above are N,N′-methylene-bis(acrylamide), N,N′-methylene-bis(methacrylamide), N,N′-methylene-bis(α-ethylacrylamide), N,N′-methylene-bis(α-propylacrylamide), N,N′-ethylene-bis(acrylamide), N,N′-ethylene-bis-(methacrylamide), N,N′-(1,6-hexamethylene)-bis(acrylamide), N,N′-(1,6-hexamethylene)-bis(methacrylamide), N,N′-ethylidene-bis-(acrylamide), N,N′-ethylidene-bis(-methacrylamide), N,N′-methylene-bis(N-methyl acrylamide), N,N′-butylidene-bis(methacrylamide) and N,N′-propylidene-bis(acrylamide). These compounds may be prepared by conventional reactions well known in the art, for example, in U.S. Pat. No. 2,475,846 (to American Cyanamid), 1949.

Also useful monomers are those wherein X in formula II above is —O—. When A is alkylene or substituted alkylene, the compounds are polyacrylates of certain polyhydric alcohols. These acrylates may be illustrated by the following formulas.

When A is alkylene, this is descriptive of compounds having the formulas

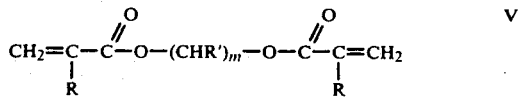

wherein R is hydrogen or a $C_1$-$C_3$ alkyl group, R′ is hydrogen, a $C_1$-$C_3$ alkyl group or phenyl, m is 1 to 8 when R′ is hydrogen and 1 when R′ is $C_1$-$C_3$ alkyl or phenyl, and

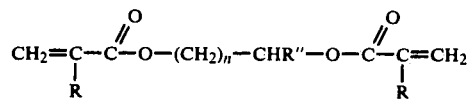

wherein R is hydrogen or a $C_1$–$C_3$ alkyl group and R" is a $C_1$–$C_4$ alkyl group, and n is 1 to 4.

Representative of compounds of formula V are ethylene glycol diacrylate, ethylene glycol dimethacrylate, ethylene glycol di(α-ethylacrylate), ethylene glycol di(α-propylacrylate), 1,3-propylene glycol diacrylate, 1,4-butylene glycol diacrylate, 1,8-octanediol dimethacrylate, and ethylidene-bis(acrylate).

Representative of compounds of formula VI are 1,2-propylene glycol diacrylate, 1,3-butanediol dimethacrylate, and 1,2-butanediol diacrylate.

When X in formula II is O and A is substituted alkylene, this is descriptive of compounds having the formulas

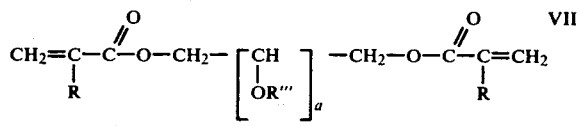

wherein R is hydrogen or a $C_1$–$C_3$ alkyl group, R''' is hydrogen or a

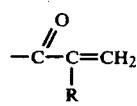

group and a is 1 to 4,

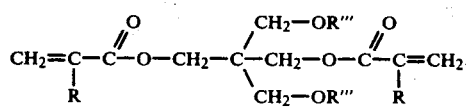

where R is hydrogen or a $C_1$–$C_3$ alkyl group and R''' is hydrogen or a

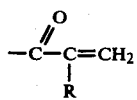

group, and

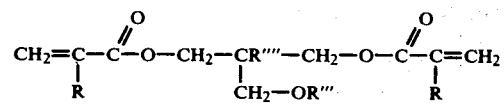

wherein R is hydrogen or a $C_1$–$C_3$ alkyl group, R''' is hydrogen or a

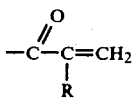

group and R'''' is a methyl or ethyl group.

Representative of compounds of formula VII are glycerol triacrylate, 1,3-glycerol dimethacrylate, erythritol diacrylate, mannitol diacrylate and mannitol trimethacrylate.

Representative of compounds of formula VIII are pentaerythritol diacrylate, pentaerythritol triacrylate, pentaerythritol tetraacrylate and pentaerythritol tetramethacrylate.

Representative of compounds of formula IX are trimethylolethane diacrylate, trimethylolpropane triacrylate and trimethylolpropane dimethacrylate.

Closely related to the preceding acrylates are those which are derived from di-, tri- and tetra-ethylene glycol and di-, tri- and tetra-propylene glycol. These compounds are those of formula II wherein X is —O— and A is alkylene oxyalkylene, and they may be more specifically illustrated by the formula

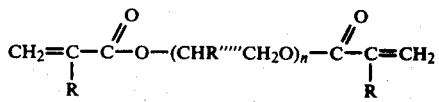

wherein R is hydrogen or a $C_1$–$C_3$ alkyl group, R''''' is hydrogen or methyl and n is 2 to 4. Representative of these compounds are diethylene glycol diacrylate, diethylene glycol dimethacrylate, triethylene glycol diacrylate, triethylene glycol dimethacrylate, tetraethylene glycol diacrylate, tetraethylene glycol dimethacrylate, dipropylene glycol diacrylate, dipropylene glycol dimethacrylate, tripropylene glycol diacrylate, tripropylene glycol dimethacrylate and tetrapropylene glycol diacrylate.

Representative of those monomers which are allyl esters are triallyl cyanurate, diallyl phthalate, diallyl maleate, diallyl fumarate, triallyl trimesate, diallyl adipate and diallyl succinate. Most of these monomers are characterized by the structural formula $$CH_2=C-CH_2-O-C-(B)_n-C-O-CH_2-C=CH_2 \quad \text{XI}$$

wherein R is hydrogen or a $C_1$–$C_3$ alkyl group, B is vinylene or an arylene, alkylene or substituted alkylene group, and n is zero or 1. Representative arylene groups are phenylene and naphthylene. Exemplary alkylene groups are methylene and ethylene, and the total number of carbon atoms in the alkylene or substituted alkylene groups is no more than 8. Other useful crosslinking monomers include divinylbenzene, divinylacetylene, diisopropenylbiphenyl and crotyl methacrylate.

The amount of crosslinking monomer may be widely varied. As already mentioned, the crosslinking monomer can constitute all of the ethylenically unsaturated component capable of forming a crosslinked polymer, and preferably will amount to at least about five percent by weight of said ethylenically unsaturated component.

Also useful as crosslinking agents are polymers containing a plurality of addition polymerizable unsaturated linkages. Representative of such polymers are the ethylenically unsaturated addition polymerizable polyesters derived from unsaturated diols or unsaturated dibasic carboxylic acids. Typical polyesters are those derived from maleic or fumaric acid and diols such as ethylene glycol, propylene glycol, trimethylene glycol and diethylene glycol. These unsaturated polymers may be used alone or in combination with a crosslinking monomer.

The photosensitive compositions also may contain a saturated polymer component as a viscosity regulating agent. Exemplary of such polymers are cellulose esters such as cellulose acetate, cellulose acetate succinate and cellulose acetate butyrate; cellulose ethers such as methyl cellulose, ethyl cellulose, benzyl cellulose, hydroxyethyl cellulose and hydroxypropyl cellulose; poly(vinyl alcohol); poly(vinyl alcohol) esters such as poly(vinyl acetate) and copolymers of vinyl acetate with other vinyl monomers such as vinyl chloride, methyl acrylate and methyl methacrylate; poly(vinyl chloride); vinylidene chloride copolymers such as poly(vinylidene chloride-acrylonitrile), poly(vinylidene chloride-methyl acrylate) and poly(vinylidene chloride-vinyl acetate); polyacrylates and polyacrylate esters such as poly(methyl methacrylate) and poly(ethyl methacrylate); poly(ethylene oxide); poly(vinyl acetals) such as poly(vinyl vutyral) and poly(vinyl formal) and polystyrene. The saturated polymer component may constitute from about five to about 90% by weight of the photosensitive composition.

The sensitizers used in the process of this invention are generally well known and are characterized as being useful in converting triplet oxygen to singlet oxygen. Among the best sensitizers are fluorescein derivatives, xanthene dyes, porphyrins and porphins, polycyclic aromatic hydrocarbons and phthalocyanines. The preferred sensitizers are methylene blue and zinc tetraphenylporphin. Additional useful sensitizers are: erythrosin B; rose bengal; eosin Y; crystal violet; methylene green; safrin bluish; 1,1-diethyl-2,2'-cyanine iodide; 1-ethyl-2[3-(1-ethylnaphtho-[1,2d]-thiazolin-2-yldiene-2-methylpropenyl]-naphthol-[1,2a]-thiazolium bromide; pinacyanol chloride; ethyl red; 1,1'-diethyl-2,2'-dicarbocyanine iodide; 3,3'-diethyloxycarbocyanine iodide; 3,3'-diethyl-thiazolino carbocyanine iodide; fluorescein; methylene violet; methylene blue oleate; methylene blue dodecyl benzene sulfonate; copper phthalocyanine; pentacene; naphthacene; copper tetrraphenylpropin; tin tetraphenylporphin; acridine orange; methylene violet, Bernthsen; hemin; chlorophyll; porphyrazines; octaphenylporphins; benzoporphins; hypericin; 3,4-benzpyrene; acridine; rubrene; 4,4'-bis(dimethylamino) benzophenone; fluorenone; anthraquinone; phenanthrenequinone; fluorene; triphenylene, phenanthrene; naphthalene; azulene; anthracene; tetracene; carbazole; benzil; benzilic acid; xanthone; anthrone; benzanthrone; coronene; di-α-naphthyl ketone; benzylacetophenone; chrysene; pyrene; 1,2-benzanthracene; acenaphthylene; a-indanone; 1,4-naphthaquinone; phenyl-1-naphthyl ketone; 1-acetonaphthone; 2-acetonaphthone; 1-naphthaldehyde; 1,2,5,6-dibenzanthracene; thioxanthone; 9,10-dichloroanthracene; and benzalacetophenone.

The amount of sensitizer is not critical, but the best results are obtained when the concentration is adjusted so that 50 to 90% or more of the incident light is absorbed at the wavelength corresponding to the absorption maximum of the particular sensitizer employed.

The photosensitive compositions also may contain up to about 50% by weight of an inert particulate filler which is essentially transparent to radiation. Representative of such fillers are the organophilic silicas, the bentonites, silica and powdered glass, all having a particle size less than 0.4 mil in their maximum dimension. Particles of 0.1 micron or less in size are preferred. Such fillers can impart desirable properties to the products made from the photosensitive compositions. For example, use of submicron silica affords a printing plate with a harder and more durable image.

In the preparation of some of the photosensitive compositions of this invention, it may be desirable to have present a small amount of a phenolic antioxidant to act as an inhibitor for premature thermal polymerization during processing or storage of the compositions. Such antioxidants are well known in the art and they are exemplified by hydroquinone, di-t-butyl-p-cresol, hydroquinone monomethylether, pyrogallol, quinone, t-butyl-catechol, hydroquinone monobenzyl ether, methyl hydroquinone, amyl quinone, amyloxy hydroquinone, n-butyl phenol, phenol and hydroquinone monopropyl ether. The phenolic antioxidant may be used in an amount within the range of from about 0.001 to about 2% by weight, preferably about 1% by weight, based on the ethylenically unsaturated component of the photosensitive composition.

The photosensitive compositions of this invention may be cast from solution onto a suitable support. Ordinarily, the support member of a lithographic plate is metal-surfaced or composed of entire sheets of metal. Metals such as aluminum, zinc, chromium, tin, magnesium and steel may be used. Aluminum and zinc are preferred. In the case of metallic surfaces, oxides may be present, either through exposure to air or through special treatment. For example, in the case of aluminum, the surface may, if desired, be chemically or electrolytically anodized. In the case of a positive working lithographic plate it may be necessary to coat the metal support with a durable, oleophilic polymer coating before applying the photosensitive composition. In casting the photosensitive composition onto the support, a solution of the components in a suitable solvent may be used, and conventional coating techniques may be employed. Alternatively, those photosensitive compositions of this invention which are thermoplastic may be thermoformed in plastic fabrication equipment onto a metal substrate.

When the photosensitive elements prepared as described above are subjected to a process as described above, the photosensitive composition becomes crosslinked in the exposed areas, whereas the composition in the unexposed areas remains soluble. Subsequent removal of the soluble material, as by washing of the plate, leaves an image of the negative or positive used in the process. The solvent used in washing the plate will vary according to the solubility of the photosensitive composition. Removal of the soluble material from the unexposed areas may frequently be accelerated by brushing or scrubbing. In large scale work, application of the solvent will advantageously be carried out by means of jets or sprays.

The printing surfaces made from the photosensitive compositions of this invention are particularly applicable in lithography. However, they also are useful in classes of printing wherein the ink is carried by the raised portion of the relief, such as in dry offset printing and ordinary letterpress printing. Furthermore, the photosensitive compositions of this invention may be used as photoresists over an etchable metal. In this instance, a thin layer of the composition will become insolublized in irradiated areas and protect the metal beneath from etching, as in a photoengraving process.

As indicated above, the hydroperoxides and peroxides which are formed when the photosensitive compositions of this invention are exposed to light can be decomposed with a catalyst for peroxide decomposition selected from metal catalysts and nonmetallic reducing agents to provide free radicals necessary for subsequent polymerization and/or crosslinking reactions. In certain cases it may be desirable to incorporate the catalyst for peroxide decomposition in the photosensitive composition so that the hydroperoxides and peroxides can be decomposed concurrently with their formation. In general from about 0.001% to about 5.0% of the catalyst, based on total solids, will be incorporated in the photosensitive composition.

The preferred catalysts are salts or complexes of metals, preferably transition metals, capable of existing in more than one valence state. Vanadium oxyacetylacetonate, vanadium oxysulfate, vanadium oxy-1,1,1-trifluoroacetylacetonate, vanadium oxy-1-phenylacetylacetonate, ferric acetylacetonate-benzoin, manganese octoate, lead naphthenate and cobaltic acetylacetonate are among the preferred catalysts. Other effective catalysts include titanyl acetylacetonate, cobaltous naphthenate, cobaltous 2-ethylhexanoate, cobaltous stearate, cobaltic stearate, cobaltous acetylacetonate, manganous stearate, manganic stearate, manganous acetylacetonate, manganic acetylacetonate, manganese naphthenate, zirconium acetylacetonate, vanadyl naphthenate, ferrous sulfate, ferrous pyrophosphate, ferrous sulfide, the ferrous complex of ethylenedinitrilotetraacetic acid, ferrous o-phenanthroline, ferrous ferrocyanide, ferrous acetylacetonate and the corresponding nickel, copper, mercury and chromium compounds. Nonmetallic reducing agents which can be used to carry out decomposition of the hydroperoxides include polyamines such as diethylenetriamine, triethylenetetraamine, tetraethylenepentamine, monoamines, sodium hyposulfite and sulfur dioxide.

What we claim and desire to protect by Letters Patent is:

1. A photosensitive composition comprising (1) from about 5% to about 98% of a free radical polymerizable ethylenically unsaturated component selected from ethylenically unsaturated monomers, ethylenically unsaturated polymers and mixtures thereof; capable of forming a high molecular weight polymer by addition polymerization or cross-linking, (2) a photooxidizable component, different from the said polymerizable ethylenically unsaturated component, in an amount which will contribute to the photosensitive composition at least $1.0 \times 10^{-3}$ moles per 1000 cc. of the composition of olefinic unsaturation of the type in which there is no more than one hydrogen on each of the double bond carbons and in which there is at least one allylic hydrogen on at least one of the carbons adjacent to the double bond carbons, which allylic hydrogen is not on a bridgehead carbon, and (3) a photooxygenation sensitizer.

2. A photosensitive composition comprising (1) from about 5% to about 98% of a free radical polymerizable ethylenically unsaturated component selected from ethylenically unsaturated monomers, ethylenically unsaturated polymers and mixtures thereof; capable of forming a high molecular weight polymer by addition polymerization or cross-linking, (2) a photooxidizable component, different from the said polymerizable ethylenically unsaturated component, in an amount which will contribute to the photosensitive composition at least $1.0 \times 10^{-3}$ moles per 1000 cc. of the composition of olefinic unsaturation of the type in which there is no more than one hydrogen on each of the double bond carbons and in which there is at least one allylic hydrogen and at least one of the carbons adjacent to the double bond carbons, which allylic hydrogen is not on a bridgehead carbon, (3) a photooxygenation sensitizer, and (4) from about 5% to about 90% by weight of the photosensitive composition of a saturated polymer component as a viscosity regulating agent.

3. A photosensitive composition comprising (1) from about 5% to about 98% of a free radical polymerizable ethylenically unsaturated component selected from ethylenically unsaturated monomers, ethylenically unsaturated polymers and mixtures thereof; capable of forming a high molecular weight polymer by addition polymerization or cross-linking, (2) a photooxidizable component, different from the said polymerizable ethylenically unsaturated component, in an amount which will contribute to the photosensitive composition at least $1.0 \times 10^{-3}$ moles per 1000 cc. of the composition of olefinic unsaturation of the type in which there is no more than one hydrogen on each of the double bond carbons and in which there is at least one allylic hydrogen on at least one of the carbons adjacent to the double bond carbons, which allylic hydrogen is not on a bridgehead carbon, (3) a photooxygenation sensitizer, and (4) from about 0.001% to about 5%, based on total solids, of a catalyst for peroxide decomposition, selected from metal catalysts and nonmetallic reducing agents.

4. A photosensitive composition comprising
(1) from about 5% to about 98%, based on the photosensitive composition, of a polymerizable ethylenically unsaturated component capable of forming a high molecular weight polymer by addition polymerization or cross-linking, selected from the group consisting of
(a) a mixture of a monoethylenically unsaturated monomer having a terminal ethylenic unsaturation of the $CH_2=C<$ type and a saturated or unsaturated polymer, where the monoethylenically unsaturated monomer is present in the mixture in an amount at least equal to about 5% of the photosensitive composition,
(b) a polyethylenically unsaturated monomer selected from compounds having the structural formulae

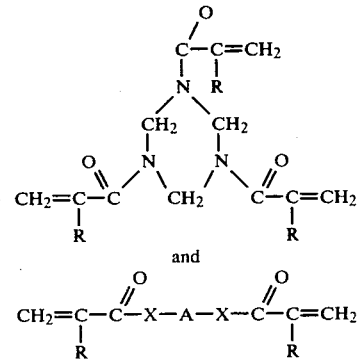

where R is selected from hydrogen and $C_1$-$C_3$ alkyl; A is selected from alkylene, substituted alkylene and alkylene oxy alkylene and both X's are selected from —NH— and —O—,
(c) a mixture of a monoethylenically unsaturated monomer having a terminal ethylenic unsaturation of the $CH_2=C<$ type and (b), (d) at least one polymer containing a plurality of addition polymerizable ethylenically unsaturated linkages, and (e) a mixture of (b) and (d), (2) a photooxidizable component, different from the said polymerizable ethylenically unsaturated component, in an amount which will contribute to the photosensitive composition at least $1.0 \times 10^{-3}$ moles per 1000 cc. of the composition of olefinic unsaturation of the type in which there is no more than one hydrogen atom on each of the double bond carbons and in which there is at least one allylic hydrogen on at least one of the carbons adjacent to the double bond carbons, which allylic hydrogen is not on a bridgehead carbon, and (3) a photooxygenation sensitizer.

* * * * *

UNITED STATES PATENT AND TRADEMARK OFFICE
CERTIFICATE OF CORRECTION

PATENT NO. : 4,271,259

DATED : June 2, 1981

INVENTOR(S) : David S. Breslow and David A. Simpson

It is certified that error appears in the above—identified patent and that said Letters Patent are hereby corrected as shown below:

Col. 2, line 4 " compounds " should read
-- components --;

Col. 2, line 5 " for " should read -- of --;

Col. 4, line 3 in Table at top of Column under "Grams", " 0.23 " should read -- 0.023 --;

Col. 5, line 5 in Table at bottom of Column " ehtyl " should read -- ethyl --;

Col. 7, line 7 " Altac 382E " should read
-- Atlac 382E --;

UNITED STATES PATENT AND TRADEMARK OFFICE
CERTIFICATE OF CORRECTION

PATENT NO. : 4,271,259

DATED : June 2, 1981

INVENTOR(S) : David S. Breslow and David A. Simpson

It is certified that error appears in the above-identified patent and that said Letters Patent are hereby corrected as shown below:

Col. 8, line 25 in the Table in the middle of the Column under "Grams", " 3.00 " should read -- 2.00 --;

Col. 9, lines 46 and 47 in the Table at the bottom of the page " methanol, " should read -- methanol) -- and " 0.030 " should read -- 0.038 --;

Col. 17, line 41 " copper tetrraphenylpropin " should read -- copper tetraphenylporphin --;

UNITED STATES PATENT AND TRADEMARK OFFICE
CERTIFICATE OF CORRECTION

PATENT NO. : 4,271,259
DATED : June 2, 1981
INVENTOR(S) : David S. Breslow and David A. Simpson It is certified that error appears in the above-identified patent and that said Letters Patent are hereby corrected as shown below:

Col. 6 in the formula between lines 32 and 43

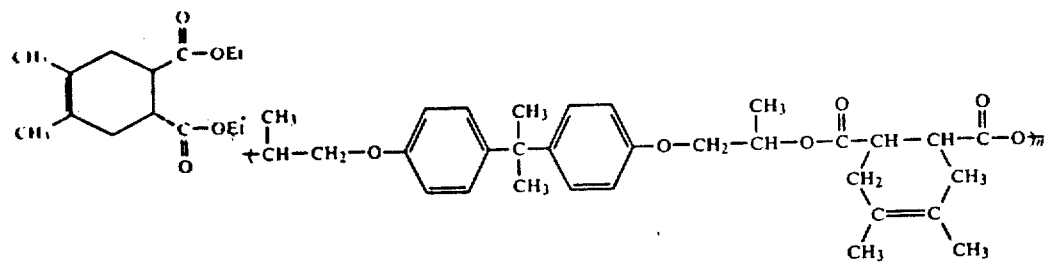

should read

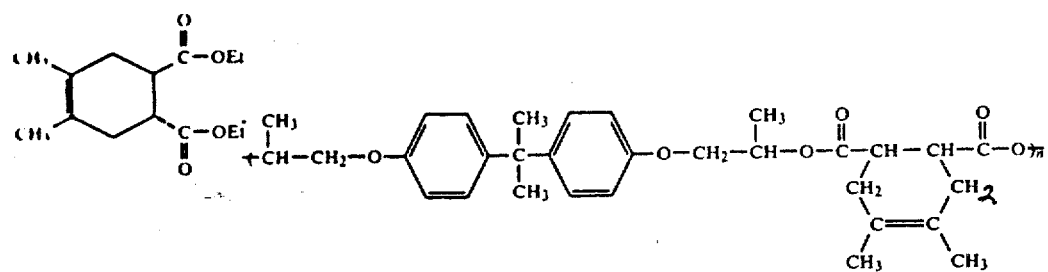

Signed and Sealed this

Eighth Day of September 1981

[SEAL]

Attest:

GERALD J. MOSSINGHOFF

Attesting Officer      Commissioner of Patents and Trademarks